(12) United States Patent
Furukawa et al.

(10) Patent No.: US 8,218,331 B2
(45) Date of Patent: Jul. 10, 2012

(54) ELECTRONIC COMPONENT MODULE

(75) Inventors: Hirotada Furukawa, Tokyo (JP);
Mitsuru Ishibashi, Tokyo (JP)

(73) Assignee: TDK Corporation, Tokyo (JP)

( * ) Notice: Subject to any disclaimer, the term of this patent is extended or adjusted under 35 U.S.C. 154(b) by 287 days.

(21) Appl. No.: 12/730,474

(22) Filed: Mar. 24, 2010

(65) Prior Publication Data

US 2010/0246151 A1    Sep. 30, 2010

(30) Foreign Application Priority Data

Mar. 26, 2009  (JP) ................................ 2009-076586

(51) Int. Cl.
  *H05K 1/18*    (2006.01)
  *H05K 7/00*    (2006.01)
  *H01L 23/48*   (2006.01)

(52) U.S. Cl. ........ 361/761; 361/760; 361/762; 361/782; 257/690; 257/693

(58) Field of Classification Search ........................ None
See application file for complete search history.

(56) References Cited

U.S. PATENT DOCUMENTS

| | | | |
|---|---|---|---|
| 6,201,701 B1 * | 3/2001 | Linden et al. ................. | 361/720 |
| 6,862,189 B2 * | 3/2005 | Higuchi ......................... | 361/767 |
| 6,885,278 B2 | 4/2005 | Nakao et al. | |
| 7,180,749 B2 * | 2/2007 | Tsukahara et al. ............ | 361/761 |
| 7,782,624 B2 * | 8/2010 | Fujii .............................. | 361/720 |
| 7,808,796 B2 * | 10/2010 | Hatanaka et al. ............. | 361/760 |
| 7,838,964 B2 * | 11/2010 | Carobolante et al. ......... | 257/531 |
| 7,894,200 B2 * | 2/2011 | Yoshino et al. ............... | 361/761 |
| 7,948,057 B2 * | 5/2011 | Furukawa et al. ............ | 257/531 |
| 8,058,960 B2 * | 11/2011 | Hebert et al. ................. | 336/200 |
| 8,064,211 B2 * | 11/2011 | Furukawa et al. ............ | 361/760 |
| 2005/0207133 A1 * | 9/2005 | Pavier et al. .................. | 361/761 |

FOREIGN PATENT DOCUMENTS

JP    A-2004-63676    2/2004

* cited by examiner

Primary Examiner — Boris Chervinsky
(74) Attorney, Agent, or Firm — Oliff & Berridge, PLC

(57) ABSTRACT

In a DC-DC converter module, a first through-hole conductor provided in a substrate as a first lead for electrically connecting a terminal as a voltage output terminal of an IC and a first terminal of an inductor component to each other and a second through-hole conductor provided in the substrate as a second lead for electrically connecting a terminal as a switching terminal of the IC and a second terminal of the inductor component to each other oppose each other in a direction intersecting a direction in which the first and second terminals oppose each other in the inductor component (i.e., the longitudinal direction of the substrate and inductor component).

5 Claims, 11 Drawing Sheets (a)

(b)

(c)

(a)

(b)

(c)

(a)

(b)

(c)

(a)

(b)

ELECTRONIC COMPONENT MODULE

BACKGROUND OF THE INVENTION

1. Field of the Invention

One embodiment of the present invention relates to an electronic component module such as a module for a DC-DC converter, for example.

2. Related Background Art

Electronic component modules such as modules for DC-DC converters used in electronic devices such as cellular phones have recently been attaining higher integration without stopping, while being required to be made smaller. Therefore, an electronic component module including a substrate incorporating a circuit component such as an IC therein and a passive component such as an inductor component arranged on one main face side of the substrate and electrically connected to a circuit component has been developed (see, for example, Japanese Patent Application Laid-Open No: 2004-63676).

SUMMARY OF THE INVENTION

For preventing the passive component such as the inductor component from deteriorating their characteristics, it is important for electronic component modules such as the one mentioned above to inhibit the heat generated in the substrate incorporating the circuit component such as the IC therein from propagating to the passive component.

It is therefore an object of one embodiment of the present invention to provide an electronic component module which can inhibit the heat generated in the substrate from propagating to the passive component.

For achieving the above-mentioned object, the electronic component module in accordance with one embodiment of the present invention includes a substrate including a circuit component and a passive component arranged on one main face side of the substrate and electrically connected to the circuit component; wherein the substrate is provided with a first lead for electrically connecting the circuit component and a first terminal of the passive component to each other and a second lead for electrically connecting the circuit component and a second terminal of the passive component to each other, the first lead including a first electrode layer connected to the first terminal and a first through-hole conductor connected to the first electrode layer, the second lead including a second electrode layer connected to the second terminal and a second through-hole conductor connected to the second electrode layer; and wherein the first and second through-hole conductors oppose each other in a direction intersecting a direction in which the first and second terminals oppose each other.

In this electronic component module, the first through-hole conductor provided in the substrate as the first lead for electrically connecting the circuit component and the first terminal of the passive component to each other and the second through-hole conductor provided in the substrate as the second lead for electrically connecting the circuit component and the second terminal of the passive component to each other oppose each other in a direction intersecting the direction in which the first and second terminals oppose each other. A relatively large current can flow through the first and second leads among the leads provided in the substrate. Since the first and second through-hole conductors oppose each other in a direction intersecting the direction in which the first and second terminals oppose each other, the distance between the first and second through-hole conductors can become longer, thereby promoting the dissipation of the heat generated from the first and second leads. Therefore, this electronic component module can inhibit the heat generated in the substrate from propagating to the passive component.

Preferably, the first and second through-hole conductors are positioned within a region where the passive component is arranged in the one main face. This structure can effectively utilize the space in the substrate, thereby making the electronic component module smaller.

Preferably, the first electrode layer extends from the first through-hole conductor to the opposite side of the second through-hole conductor in the direction in which the first and second terminals oppose each other, while the second electrode layer extends from the second through-hole conductor to the opposite side of the first through-hole conductor in the direction in which the first and second terminals oppose each other. This structure can more efficiently dissipate the heat generated from the first and second leads through the first and second electrode layers extending to their opposite sides.

Preferably, the substrate is provided with a third through-hole conductor as the first lead and a fourth through-hole conductor as the second lead, while the third and fourth through-hole conductors are positioned on one side of the circuit component in a direction parallel to the one main face. This structure can more efficiently dissipate the heat generated from the first and second leads through the third and fourth through-hole conductors positioned on one side of the circuit component.

Preferably, in this case, the circuit component has a center positioned on the other side of a center of the substrate in the direction parallel to the one main face. This structure can effectively utilize the space in the substrate, thereby making the electronic component module smaller.

DESCRIPTION OF THE PREFERRED EMBODIMENTS

Figure 1:
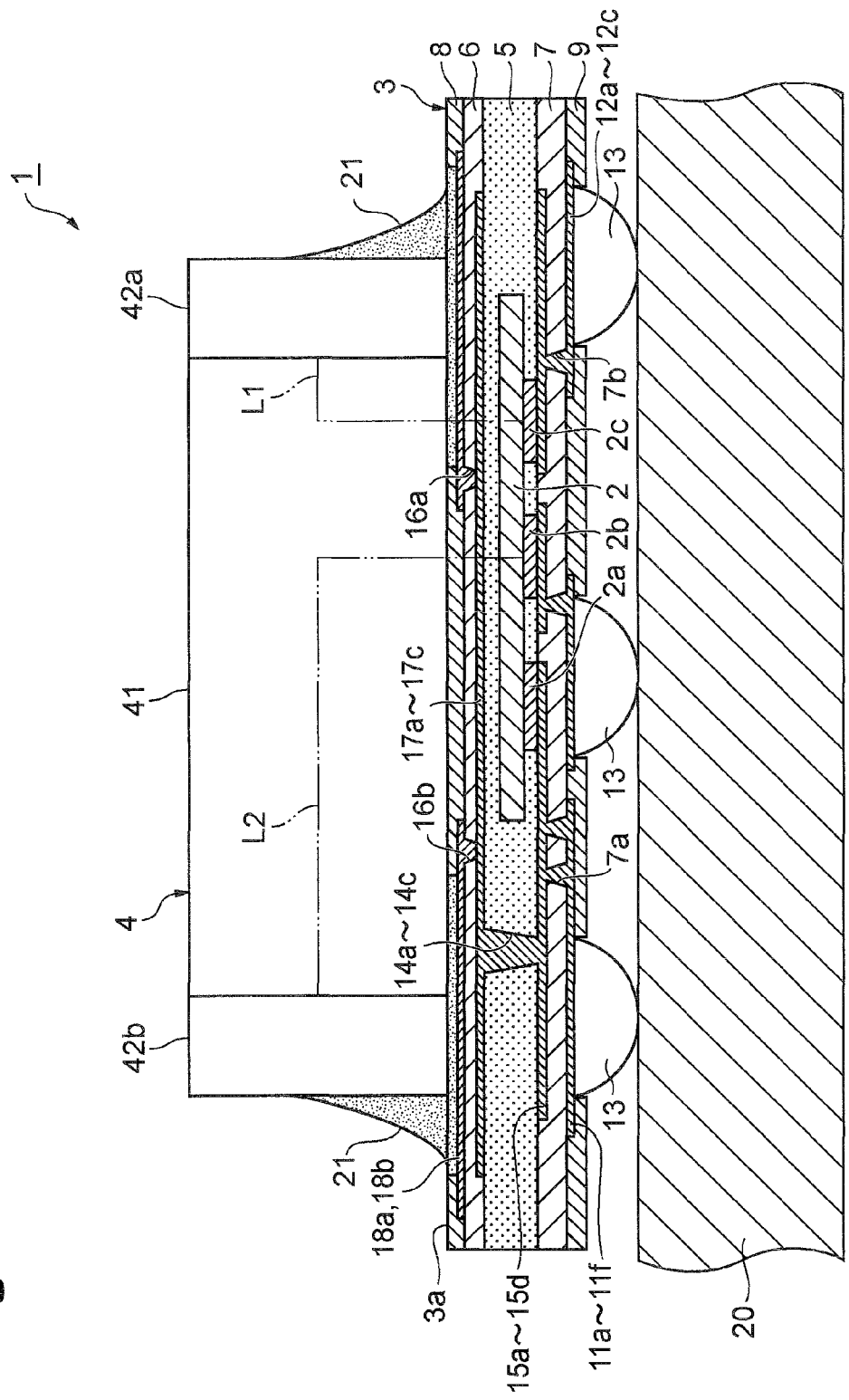
FIG. 1 is a sectional view of a DC-DC converter module as an embodiment of the electronic component module in accordance with the present invention.

In the following, preferred embodiments of the present invention will be explained in detail with reference to the drawings. The same or equivalent parts in the drawings will be referred to with the same signs while omitting their overlapping descriptions.

FIG. 1 is a sectional view of a DC-DC converter module as an embodiment of the electronic component module in accordance with the present invention. As illustrated in FIG. 1, this DC-DC converter module (electronic component module) 1 includes a substrate 3 incorporating an IC (circuit component) 2 therein and an inductor component (passive component) 4 arranged on the front face (one main face) 3a side of the substrate 3 and electrically connected to the IC 2. The DC-DC converter module 1 is a small-size integrated power supply module mounted on a motherboard 20 of an electronic device such as a cellular phone, for example. A capacitor is separately mounted on the motherboard 20, whereby the DC-DC converter module 1 operates as a DC-DC converter.

The inductor component 4, which is a so-called chip inductor, has a rectangular parallelepiped main body 41 and a pair of terminals (first and second terminals) 42a, 42b. The main body 41 is made of a magnetic material such as ferrite and has a coil therewithin. The pair of terminals 42a, 42b are disposed at both longitudinal end parts of the main body 41, respectively.

Figure 2:
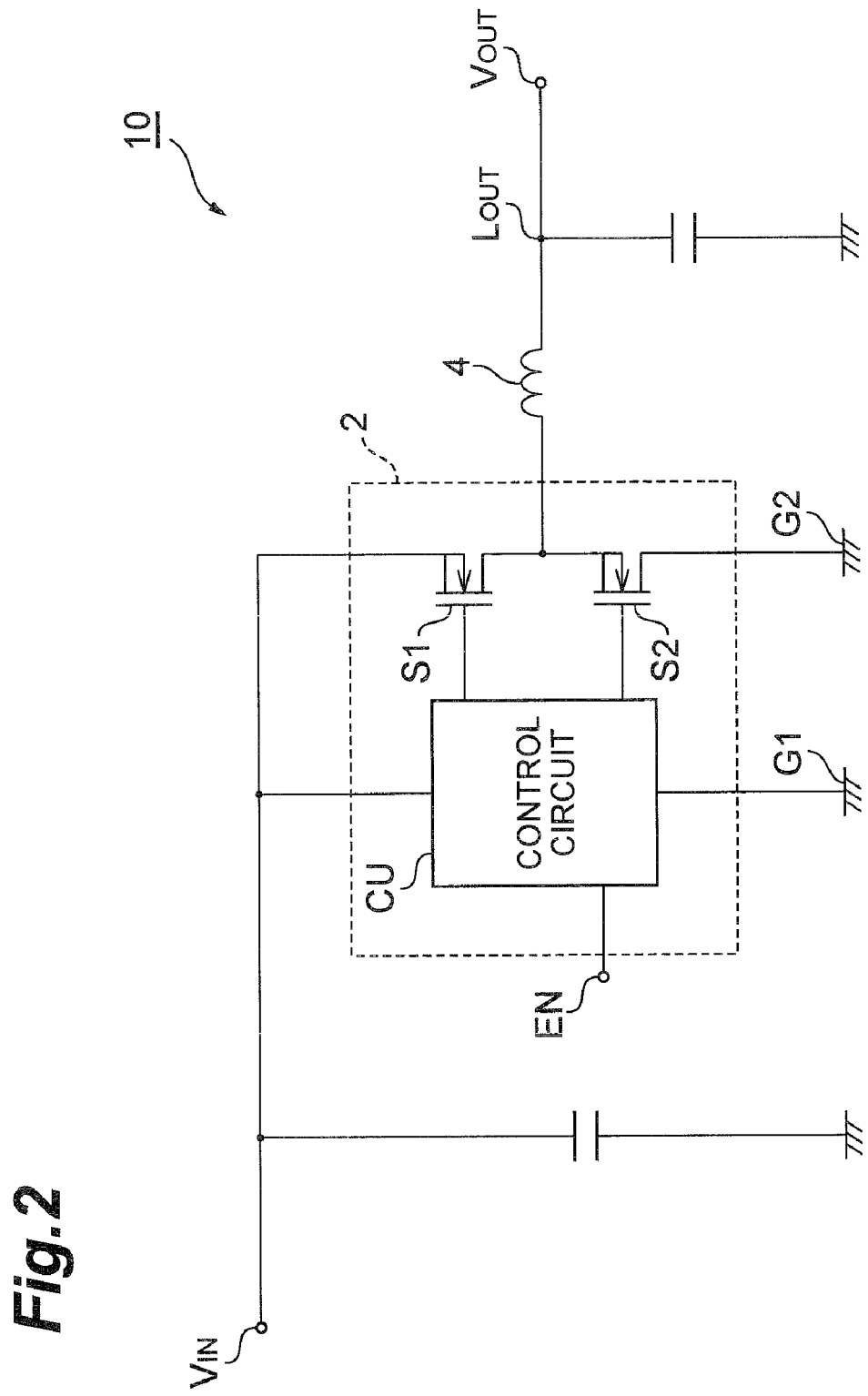
FIG. 2 is a circuit diagram of the DC-DC converter module of FIG. 1.

FIG. 2 is a circuit diagram of the DC-DC converter module in FIG. 1. As illustrated in FIG. 2, the DC-DC converter module 1 constitutes a circuit 10 which is a typical chopper type DC-DC converter circuit. The IC 2 has a control circuit CU and switching devices S1, S2. By driving the switching devices S1, S2, the control circuit CU performs a predetermined step-up or step-down action for an input DC voltage fed from a voltage input terminal $V_{IN}$. An enable terminal EN is attached to the control circuit CU. The inductor component 4 constitutes a smoothing circuit with a capacitor and outputs a smooth output DC voltage from a voltage output terminal $V_{OUT}$.

The structure of the above-mentioned substrate 3 will now be explained in detail. As illustrated in FIG. 1, the substrate 3 has a resin layer 5 having the IC 2 embedded therein. A resin layer 6 is mounted on one side (the upper side, i.e., the inductor component 4 side, in FIG. 1) of the resin layer 5, while a resin layer 7 is mounted on the other side (the lower side in FIG. 1) of the resin layer 5. Further, a resist layer 8 is mounted on one side of the resin layer 6, while a resist layer 9 is mounted on the other side of the resin layer 7. The substrate 3 is thus constructed as a multilayer body having a rectangular plate form.

Figure 3:
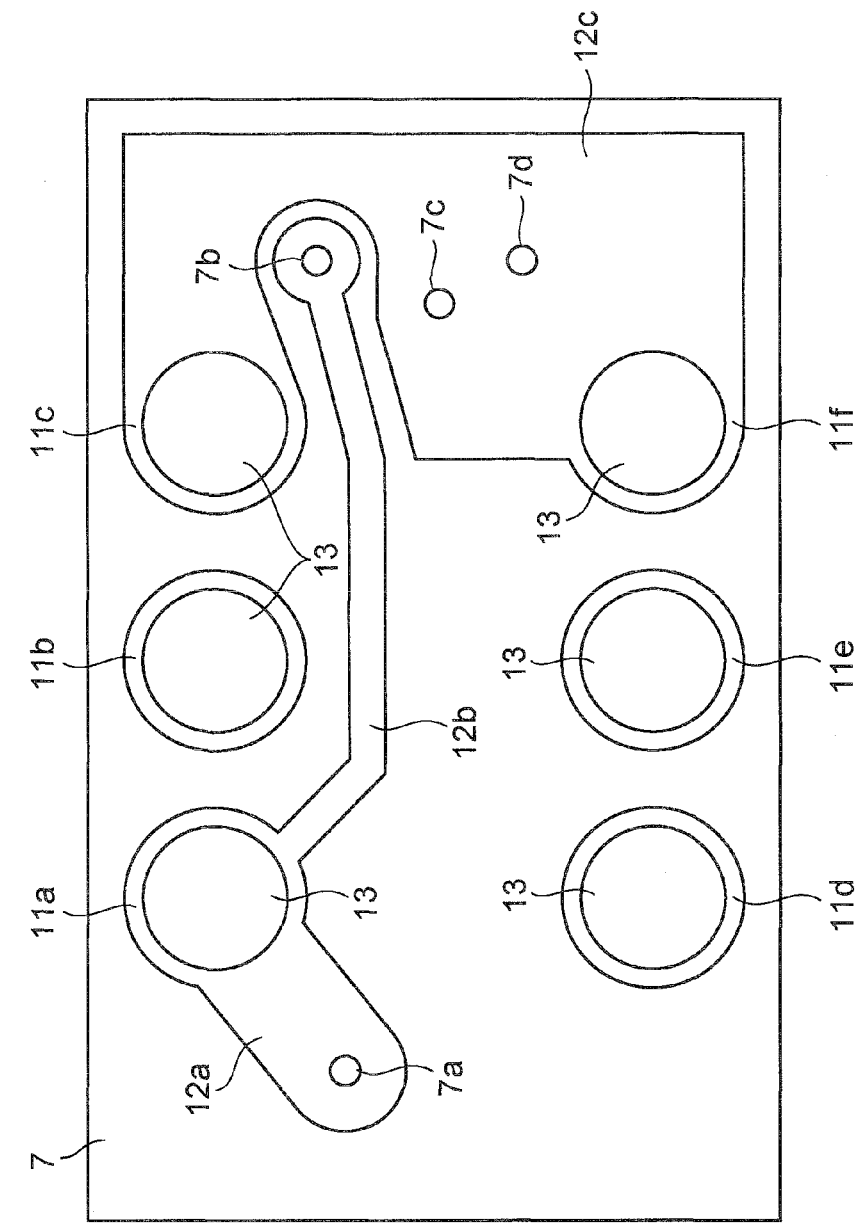
FIG. 3 is a view of a boundary part between a resin layer on the other side and a resist layer on the other side in FIG. 1 as seen from the other side.

FIG. 3 is a view of a boundary part between the resin layer on the other side and the resist layer on the other side in FIG. 1 as seen from the other side. As illustrated in FIGS. 1 and 3, electrode layers 11a to 11f to become terminals of the DC-DC converter module 1 are formed between the resin layer 7 and the resist layer 9 and exposed to the other side through openings formed in the resist layer 9. Solder bumps 13 for electrically and mechanically connecting the DC-DC converter module 1 to the motherboard 20 are arranged on the respective electrode layers 11a to 11f and project to the other side through the openings formed in the resist layer 9.

The electrode layer 11a corresponds to the voltage output terminal $V_{OUT}$, while the electrode layers 11c, 11f correspond to grounding terminals G1, G2 illustrated in FIG. 2. The electrode layers 11d, 11e correspond to the voltage input terminal $V_{IN}$ and enable terminal EN illustrated in FIG. 2, respectively. The electrode layer 11b functions as a mode terminal into which a control signal for controlling the switching timing of the switching devices S1, S2 is fed.

The resin layer 7 is provided with through-hole conductors 7a to 7d. The through-hole conductor 7a is electrically connected to the electrode layer 11a through an electrode layer 12a formed between the resin layer 7 and the resist layer 9, while the through-hole conductor 7b is electrically connected to the electrode layer 11a through an electrode layer 12b formed between the resin layer 7 and the resist layer 9. The through-hole conductors 7c, 7d are electrically connected to the electrode layers 11c, 11f through an electrode layer 12c formed between the resin layer 7 and the resist layer 9.

The through-hole conductors 7a to 7d, each of which is a through electrode constructed by arranging a conductive material such as copper within a through hole formed in the resin layer 7, may be made by the conductive material forming a film on the inner face of the through hole or filling the through hole. Each of the electrode layers 11a to 11f, 12a to 12c is a film-like electrode pattern made of a conductive material such as copper. The same holds in through-hole conductors and electrode layers which will be explained later.

Figure 4:
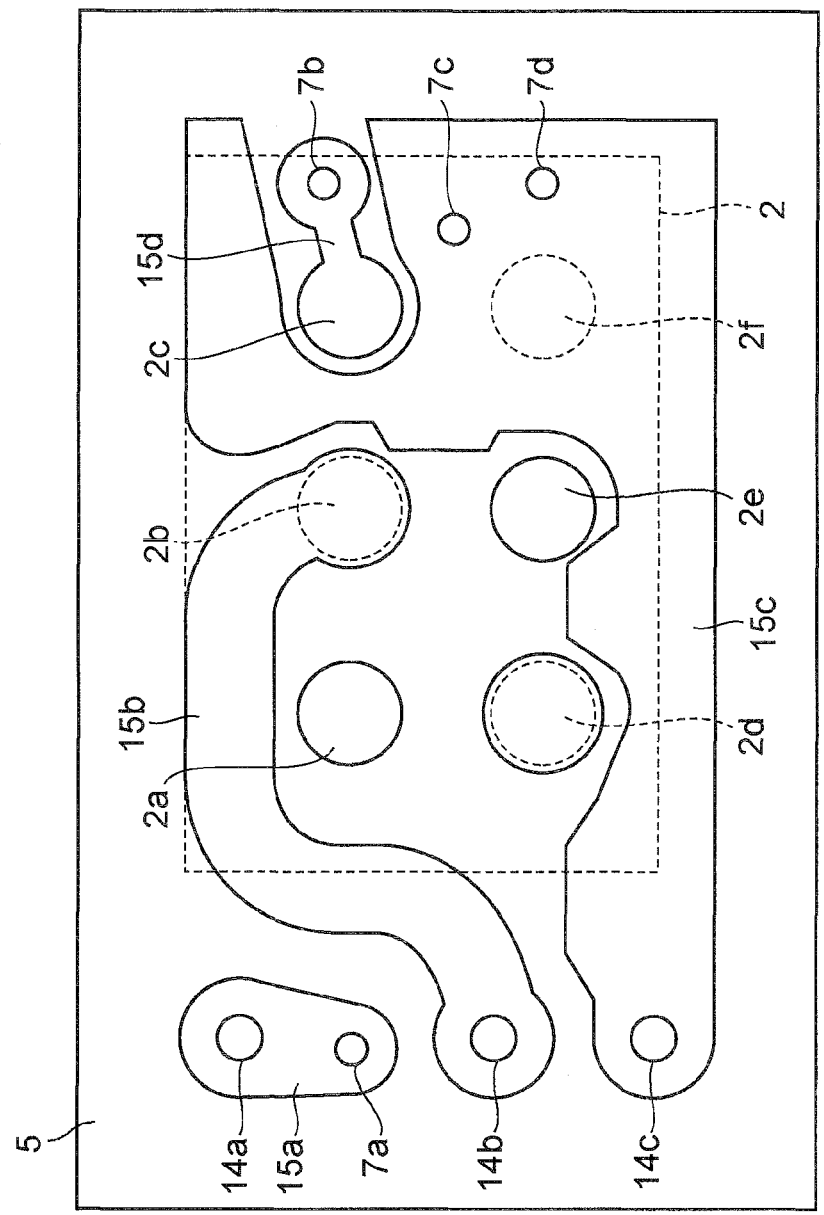
FIG. 4 is a view of a boundary part between a resin layer in the center and the resin layer on the other side in FIG. 1 as seen from the other side.

FIG. 4 is a view of a boundary part between the center resin layer and the resin layer on the other side in FIG. 1 as seen from the other side. As illustrated in FIGS. 1 and 4, terminals 2a to 2f of the IC 2 embedded in the resin layer 5 are exposed to the boundary between the resin layers 5, 7. The terminal 2a is a mode terminal of the IC 2, while the terminal 2b is a switching terminal of the IC 2. The terminal 2c is a voltage output control terminal of the IC 2, while the terminal 2d is a voltage input terminal of the IC 2. The terminal 2e is an enable terminal of the IC 2, while the terminal 2f is the grounding terminal of the IC 2. The terminal 2c is electrically connected to the through-hole conductor 7b provided in the resin layer 7 through an electrode layer 15d formed between the resin layers 5, 7.

The resin layer 5 is formed with through-hole conductors 14a to 14c. The through-hole conductor (third through-hole conductor) 14a is electrically connected to the through-hole conductor 7a in the resin layer 7 through an electrode layer 15a formed between the resin layers 5, 7, while the through-hole conductor (fourth through-hole conductor) 14b is electrically connected to the terminal 2b of the IC 2 through an electrode layer 15b formed between the resin layers 5, 7. The through-hole conductor 14c is electrically connected to the through-hole conductors 7c, 7d in the resin layer 7 and the terminal 2f of the IC 2 through an electrode layer 15c formed between the resin layers 5, 7. The electrode layer 15c extends such that at least a part thereof overlaps the IC 2 on the other side (the lower side in FIG. 1) in a direction perpendicular to the front face 3a of the substrate 3 as seen in this direction.

Through predetermined electrode and through-hole conductor, the terminal 2a acting as the mode terminal of the IC 2 is electrically connected to the electrode layer 11b functioning as the mode terminal of the DC-DC converter module 1. Through predetermined electrode and through-hole conductor, the terminal 2d acting as the voltage input terminal of the IC 2 is electrically connected to the electrode layer 11d corresponding to the voltage input terminal $V_{IN}$ of the DC-DC converter module 1. Through predetermined electrode and through-hole conductor, the terminal 2e acting as the enable terminal of the IC 2 is electrically connected to the electrode layer 11e corresponding to the enable terminal EN of the DC-DC converter module 1.

Figure 5:
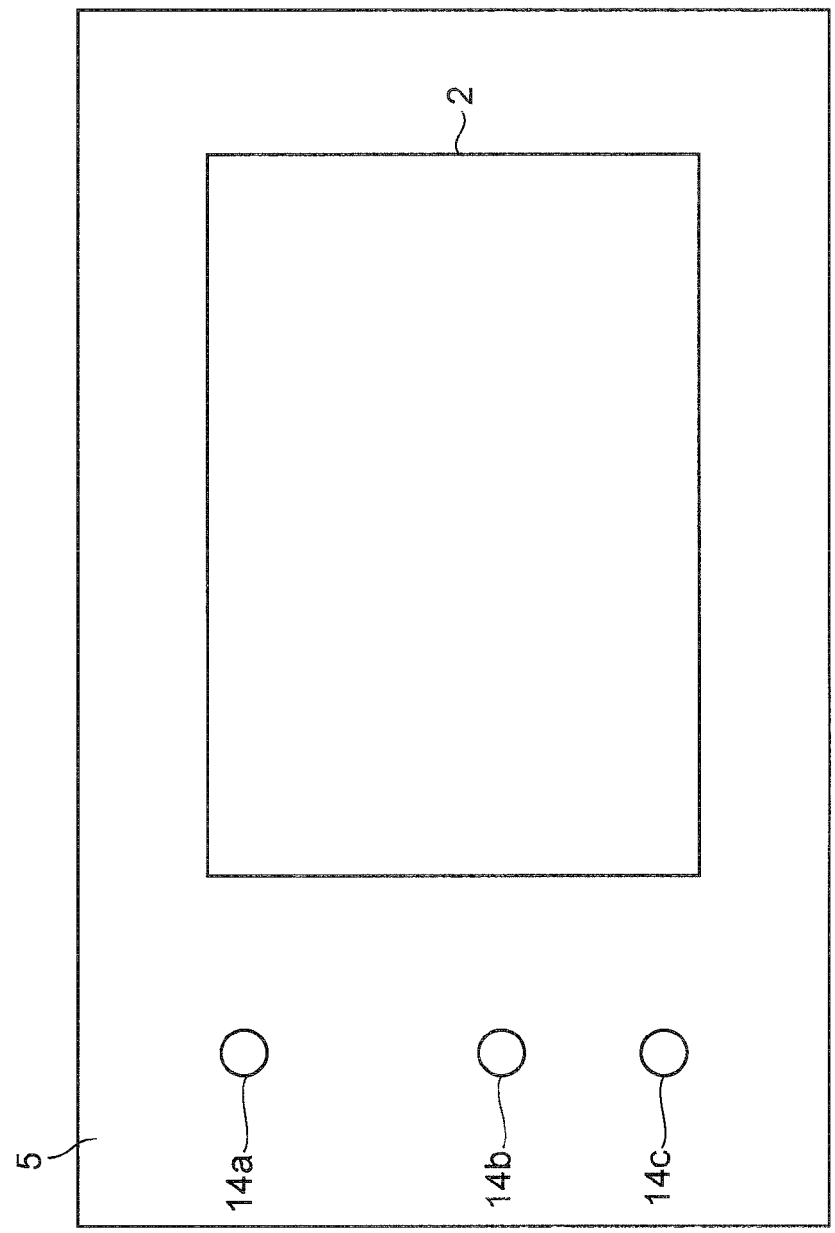
FIG. 5 is a view of a cross section of the center resin layer of FIG. 1 as seen from the other side.

FIG. 5 is a view of a cross section of the center resin layer of FIG. 1 as seen from the other side. As illustrated in FIGS. 1 and 5, the through-hole conductors 14a to 14c are positioned on one side (the left side in FIG. 5) of the IC 2 in the longitudinal direction of the substrate 3 (a direction parallel to one main face of the substrate). The center of the IC 2 is located on the other side (the right side in FIG. 5) of the center of the resin layer (i.e., the center of the substrate 3) in the longitudinal direction of the substrate 3.

Figure 6:
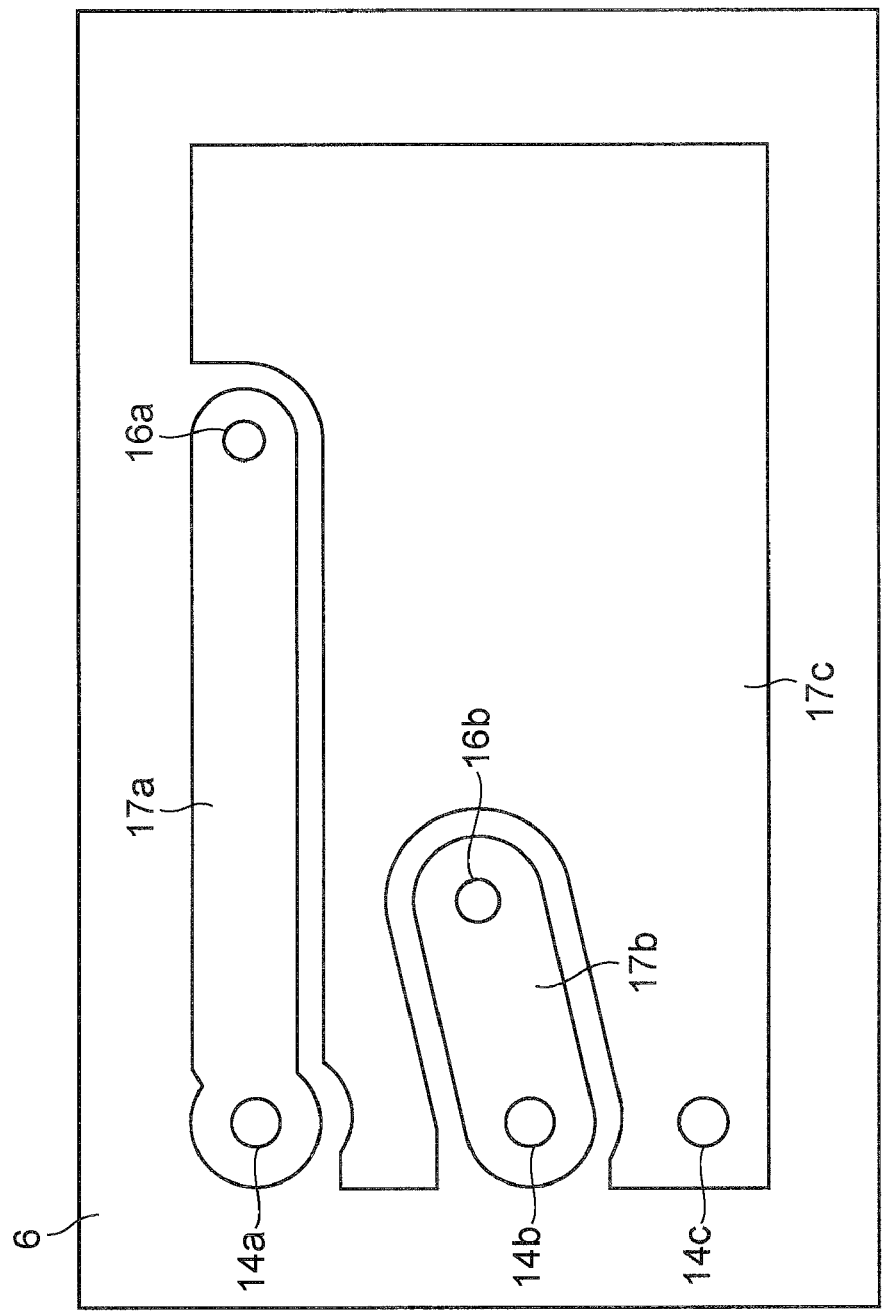
FIG. 6 is a view of a boundary part between a resin layer on one side and the center resin layer in FIG. 1 as seen from the other side.

FIG. 6 is a view of a boundary part between the resin layer on one side and the center resin layer in FIG. 1 as seen from the other side. As illustrated in FIGS. 1 and 6, the resin layer 6 is provided with through-hole conductors (first and second through-hole conductors) 16a, 16b. The through-hole conductor 16a is electrically connected to the through-hole conductor 14a in the resin layer 5 through an electrode layer 17a formed between the resin layers 5, 6, while the through-hole conductor 16b is electrically connected to the through-hole conductor 14b in the resin layer 5 through an electrode layer 17b formed between the resin layers 5, 6. The through-hole conductor 14c provided in the resin layer 5 is connected to an electrode layer 17c formed between the resin layers 5, 6. The electrode layer 17c is arranged between one end part of the through-hole conductor 14a and one end part of the through-hole conductor 14b and extends from therebetween such that at least a part thereof overlaps the IC 2 on one side (the upper side in FIG. 1) in a direction perpendicular to the front face 3a of the substrate 3 as seen in this direction.

Figure 7:
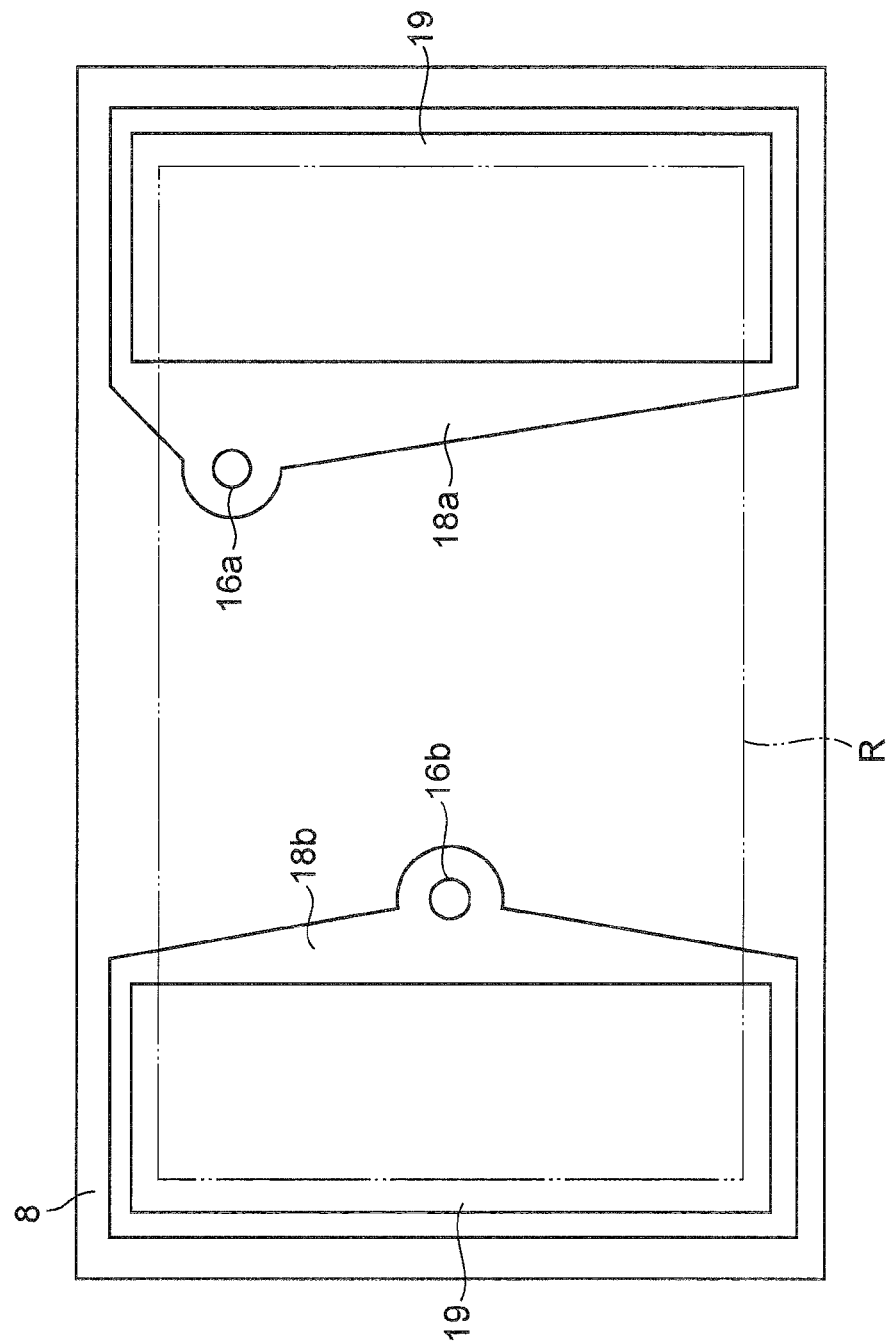
FIG. 7 is a view of a boundary part between a resist layer on one side and the resin layer on one side in FIG. 1 as seen from the other side.
Figure 8:
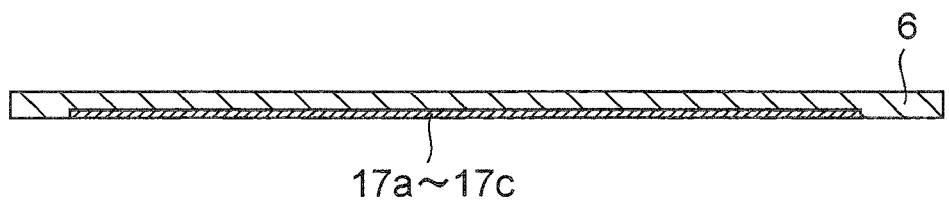
FIG. 8 is a sectional view for explaining a method of manufacturing the substrate of FIG. 1.
Figure 8:
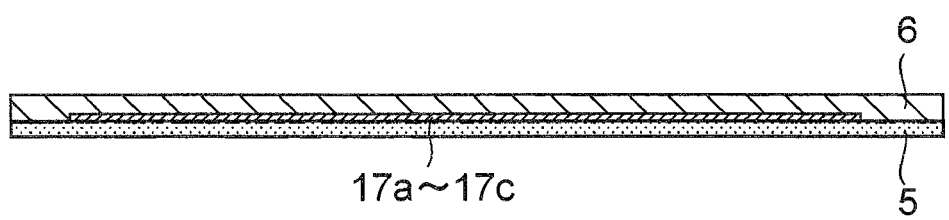
Figure 8:
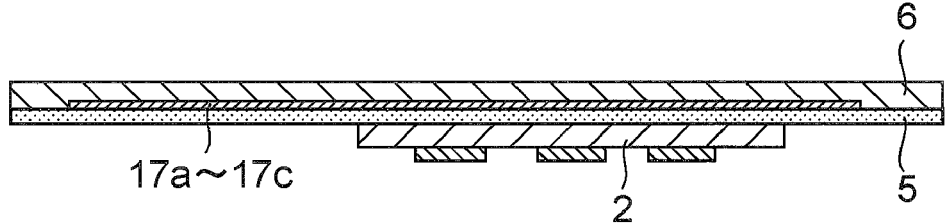
Figure 9:
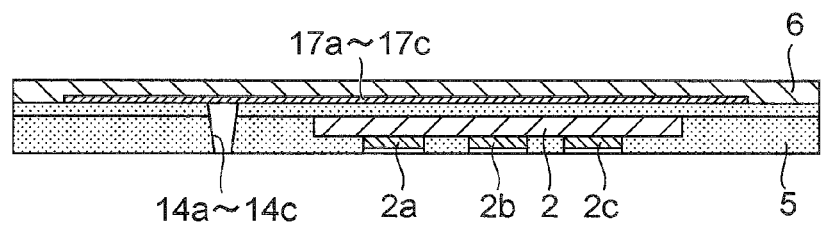
FIG. 9 is a sectional view for explaining the method of manufacturing the substrate of FIG. 1.
Figure 9:
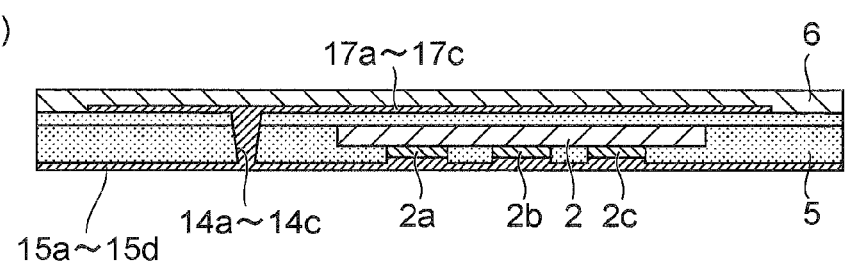
Figure 9:
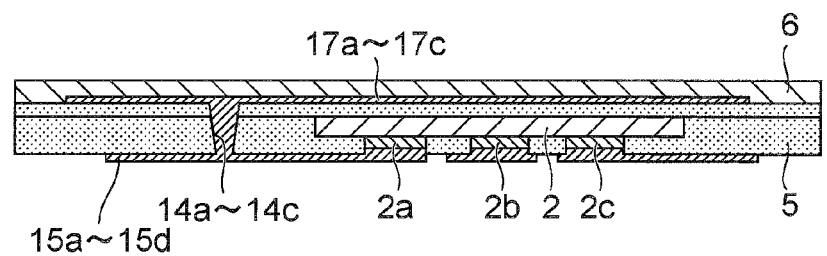
Figure 10:
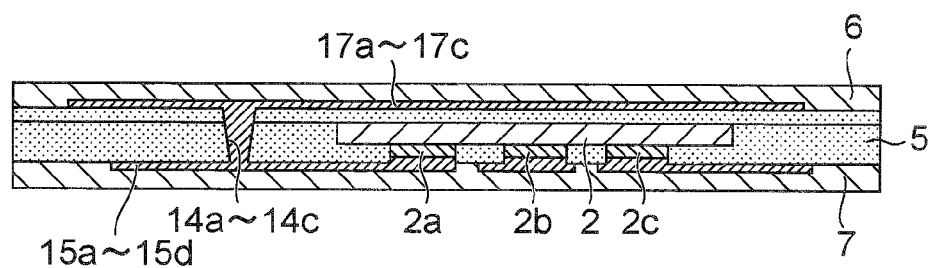
FIG. 10 is a sectional view for explaining the method of manufacturing the substrate of FIG. 1.
Figure 10:
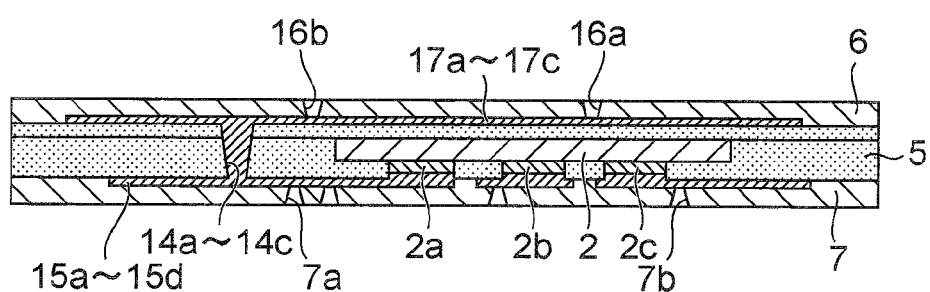
Figure 10:
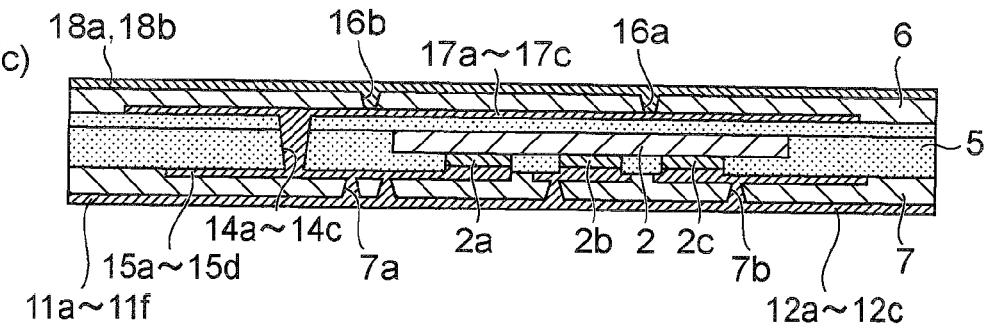
Figure 11:
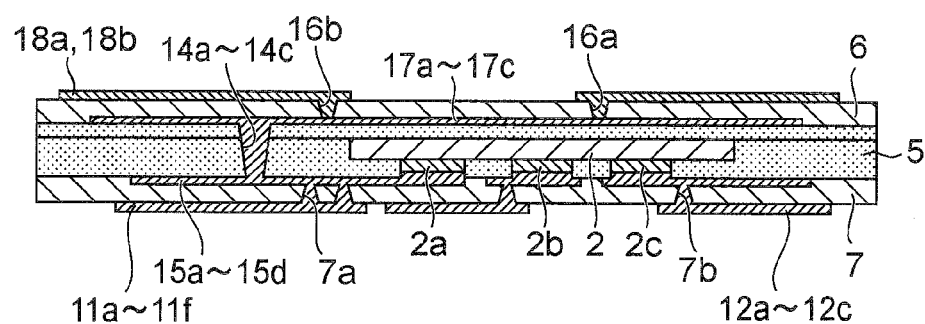
FIG. 11 is a sectional view for explaining the method of manufacturing the substrate of FIG. 1.
Figure 11:
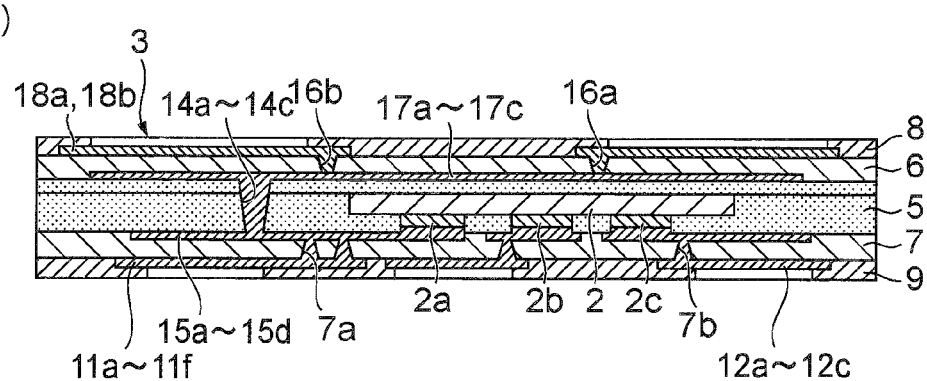

FIG. 7 is a view of a boundary part between the resist layer on one side and the resin layer on one side in FIG. 1 as seen from the other side. As illustrated in FIGS. 1 and 7, electrode layers (first and second electrode layers) 18a, 18b are formed between the resin layer 6 and the resist layer 8. The electrode layer 18a is connected to the through-hole conductor 16a provided in the resin layer 6, while the electrode layer 18b is connected to the through-hole conductor 16b provided in the resin layer 6. The electrode layers 18a, 18b are partly exposed to one side through openings formed in the resist layer 8, while their rectangular exposed parts are electrically and mechanically connected to the terminals 42a, 42b of the inductor component 4 through a solder layer 19. The connection between the electrode layer 18a and the terminal 42a and the connection between the electrode layer 18b and the terminal 42b are secured by solder fillets 21.

The through-hole conductors 16a, 16b are positioned in a region R in which the inductor component 4 is arranged on the front face 3a of the substrate 3 and oppose each other in a direction intersecting a direction in which the terminals 42a, 42b oppose each other in the inductor component 4 (i.e., the longitudinal direction of the substrate 3 and inductor component 4). Here, in a direction orthogonal to the longitudinal direction of the substrate 3 and inductor component 4, the through-hole conductor 16b is positioned at the center of the resin layer 6, while the through-hole conductor 16a is deviated from the center of the resin layer 6. The electrode layer 18a extends from the through-hole conductor 16a to the opposite side of the through-hole conductor 16b in the longitudinal direction of the substrate 3 and inductor component 4, while the electrode layer 18b extends from the through-hole conductor 16b to the opposite side of the through-hole conductor 16a in the longitudinal direction of the substrate 3 and inductor component 4. This embodiment is characterized in that the two through-hole conductors are kept from being located close to each other in the center part, though their positions are not restricted as a matter of course.

In thus constructed substrate 3, the electrode layer (voltage output terminal) 11a, electrode layer 12a, through-hole conductor 7a, electrode layer 15a, through-hole conductor 14a, electrode layer 17a, through-hole conductor 16a, and electrode layer 18a are connected in this order, so as to attain a lead (first lead) L1 for electrically connecting the electrode layer (voltage output terminal) 11a and the terminal 42a of the inductor component 4 to each other. On the other hand, the electrode layer 15b, through-hole conductor 14b, electrode layer 17b, through-hole conductor 16b, and electrode layer 18b are connected in this order, so as to attain a lead (second lead) L2 for electrically connecting the terminal 2b acting as the switching terminal of the IC 2 and the terminal 42b of the inductor component 4 to each other.

A method of manufacturing the substrate 3 of the DC-DC converter module 1 will now be explained with reference to FIGS. 8 to 11.

As illustrated in FIG. 8(a), the rear face of the resin layer 6 is patterned with the electrode layers 17a to 17c. Subsequently, as illustrated in FIG. 8(b), the rear face of the resin layer 6 is laminated with a predetermined thickness of the resin layer 5 such that the electrode layers 17a to 17c are covered therewith. Then, as illustrated in FIG. 8(c), the IC 2 is mounted on the resin layer 5 laminated by the predetermined thickness.

Next, as illustrated in FIG. 9(a), the resin layer 5 is laminated such as to bury the IC 2 and formed with through holes to become through-hole conductors 14a to 14c, while bump connections are established for the terminals 2a to 2f of the IC 2. Subsequently, as illustrated in FIG. 9(b), the rear face of the resin layer 5 is formed with an electrode layer to become the electrode layers 15a to 15d, while a conductive material is placed within the through holes to become the through-hole conductors 14a to 14c. Then, as illustrated in FIG. 9(c), the electrode layer formed on the rear face of the resin layer 5 is etched, so as to form the electrode layers 15a to 15d.

Thereafter, as illustrated in FIG. 10(a), the resin layer 7 is laminated on the rear face of the resin layer 5 so as to cover the electrode layers 15a to 15d. Subsequently, as illustrated in FIG. 10(b), the resin layer 7 is formed with through holes to become the through-hole conductors 7a to 7d, and the resin layer 6 with through holes to become the through-hole conductors 16a, 16b. Then, as illustrated in FIG. 10(c), the rear face of the resin layer 7 is formed with an electrode layer to become the electrode layers 11a to 11f, 12a to 12c, and a conductive material is placed within the through holes to become the through-hole conductors 7a to 7d. Also, the front face of the resin layer 6 is formed with an electrode layer to become the electrode layers 18a, 18b, while a conductive material is placed within the through holes to become the through-hole conductors 16a, 16b.

Next, as illustrated in FIG. 11(a), the electrode layer formed on the rear face of the resin layer 7 is etched, so as to form the electrode layers 11a to 11f, 12a to 12c, and the electrode layer formed on the front face of the resin layer 6 is etched, so as to form the electrode layers 18a, 18b. Subsequently, as illustrated in FIG. 11(b), the resist layer 9 is formed on the rear face of the resin layer 7 so as to expose the electrode layers 11a to 11f, while the resist layer 8 is formed on the resin layer 6 so as to expose a part of the electrode layers 18a, 18b, whereby the substrate 3 is obtained.

In the DC-DC converter module 1, as explained in the foregoing, the through-hole conductor 16a provided in the substrate 3 as the lead L1 for electrically connecting the electrode layer 11a (the voltage output terminal of the module 1) and the terminal 42b of the inductor component 4 to each other and the through-hole conductor 16b provided in the substrate 3 as the lead L2 for electrically connecting the terminal 2b acting as the switching terminal of the IC 2 and the terminal 42b of the inductor component 4 to each other oppose each other in a direction intersecting the direction in which the terminals 42a, 42b (i.e., the longitudinal direction of the substrate 3 and inductor component 4) oppose each other in the inductor component 4. In the DC-DC converter module 1, the switching devices S1, S2 are frequently changed over therebetween, so that a relatively large current flows through the leads L1, L2 among the leads provided in the substrate 3. Since the through-hole conductors 16a, 16b oppose each other in a direction intersecting the longitudinal direction of the substrate 3 and inductor component 4, however, the distance between the through-hole conductors 16a, 16b becomes longer, so as to promote the dissipation of the heat generated from the leads L1, L2. Therefore, the DC-DC converter module 1 can inhibit the heat generated from the substrate 3 from propagating to the inductor component 4 and deteriorating characteristics of the latter.

The electrode layer 18a extends from the through-hole conductor 16a to the opposite side of the through-hole conductor 16b in the longitudinal direction of the substrate 3 and inductor component 4, while the electrode layer 18b extends from the through-hole conductor 16b to the opposite side of the through-hole conductor 16a in the longitudinal direction of the substrate 3 and inductor component 4. The substrate 3 is further provided with the through-hole conductor 14a as the lead L1 and the through-hole conductor 14b as the lead L2, and the through-hole conductors 14a, 14b are positioned on one side (the left side in FIG. 5) of the IC 2 in the longitudinal direction. Therefore, the heat generated from the leads L1, L2 can efficiently be dissipated through the electrode layers 18a, 18b extending to their opposite sides and further through the through-hole conductors 14a, 14h positioned on one side of the IC 2.

The through-hole conductors 16a, 16b are located within the region R in which the inductor component 4 is arranged on the front face 3a of the substrate 3. The center of the IC 2 is positioned on the other side (the right side in FIG. 5) of the center of the substrate 3 in the longitudinal direction of the substrate 3. These can effectively utilize the space in the substrate 3, thereby making the DC-DC converter module 1 smaller.

Though a preferred embodiment of the present invention is explained in the foregoing, the present invention is not limited to the above-mentioned embodiment. For example, not only the inductor component but various devices such as filters combining inductors and capacitors, SAW devices (filters), capacitors, resistors, capacitors with built-in resistors, varistors, thermistors, antennas, isolators, and circulators are also employable as the passive component. The passive component may be provided with other terminals in addition to one pair of terminals as in a three-terminal device. The present invention is also applicable to electronic component modules other than the DC-DC converter module.

One embodiment of the present invention can inhibit the heat generated from the substrate from propagating to the passive component.

What is claimed is:

1. An electronic component module comprising:
a substrate including a circuit component; and
a passive component arranged on one main face side of the substrate and electrically connected to the circuit component;
wherein the substrate is provided with a first lead for electrically connecting the circuit component and a first terminal of the passive component to each other and a second lead for electrically connecting the circuit component and a second terminal of the passive component to each other, the first lead comprising a first electrode layer connected to the first terminal and a first through-hole conductor connected to the first electrode layer, the second lead comprising a second electrode layer connected to the second terminal and a second through-hole conductor connected to the second electrode layer; and
wherein the first and second through-hole conductors oppose each other in a direction intersecting a direction in which the first and second terminals oppose each other.

2. An electronic component module according to claim 1, wherein the first and second through-hole conductors are positioned within a region where the passive component is arranged in the one main face.

3. An electronic component module according to claim 1, wherein the first electrode layer extends from the first through-hole conductor to the opposite side of the second through-hole conductor in the direction in which the first and second terminals oppose each other; and
wherein the second electrode layer extends from the second through-hole conductor to the opposite side of the first through-hole conductor in the direction in which the first and second terminals oppose each other.

4. An electronic component module according to claim 1, wherein the substrate is provided with a third through-hole conductor as the first lead and a fourth through-hole conductor as the second lead; and
wherein the third and fourth through-hole conductors are positioned on one side of the circuit component in a direction parallel to the one main face.

5. An electronic component module according to claim 4, wherein the circuit component has a center positioned on the other side of a center of the substrate in the direction parallel to the one main face.

* * * * *